(12) United States Patent
Peng et al.

(10) Patent No.: US 7,495,923 B2
(45) Date of Patent: Feb. 24, 2009

(54) HEAT DISSIPATION DEVICE HAVING FIXING BRACKET

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/781,706

(22) Filed: Jul. 23, 2007

(65) Prior Publication Data

US 2009/0027855 A1 Jan. 29, 2009

(51) Int. Cl.
*H05K 7/20* (2006.01)
*F28F 7/00* (2006.01)

(52) U.S. Cl. ............... 361/719; 165/80.3; 165/185; 165/104.33; 361/704; 361/700

(58) Field of Classification Search .................. None
See application file for complete search history.

(56) References Cited

U.S. PATENT DOCUMENTS

| 5,272,599 | A | * | 12/1993 | Koenen | 361/710 |
| 6,385,046 | B1 | | 5/2002 | Ta et al. | |
| 6,671,177 | B1 | * | 12/2003 | Han | 361/719 |
| 6,717,811 | B2 | * | 4/2004 | Lo et al. | 361/698 |
| 6,822,861 | B2 | * | 11/2004 | Meir | 361/695 |
| 7,019,974 | B2 | * | 3/2006 | Lee et al. | 361/700 |
| 7,283,364 | B2 | * | 10/2007 | Refai-Ahmed et al. | 361/719 |
| 7,382,618 | B2 | * | 6/2008 | Peng et al. | 361/715 |
| 2006/0164808 | A1 | * | 7/2006 | Stefanoski | 361/700 |
| 2007/0139894 | A1 | * | 6/2007 | Chang et al. | 361/715 |

* cited by examiner

*Primary Examiner*—Gregory D Thompson
(74) *Attorney, Agent, or Firm*—Frank R. Niranjan

(57) ABSTRACT

A heat dissipation device for an add-on card in a computer enclosure includes a heat sink mounted on the add-on card and a fixing bracket. The fixing bracket includes a connecting portion fixed to the heat sink and a securing portion for being fixed to a panel of the computer enclosure and a mounting plate of the add-on card. The fixing bracket is configured to rest a part of weight of the heat sink on the computer enclosure.

13 Claims, 4 Drawing Sheets

HEAT DISSIPATION DEVICE HAVING FIXING BRACKET

BACKGROUND OF THE INVENTION

1. Field of the Invention

The present invention relates to a heat dissipation device for computer add-on cards, and more particularly to a heat dissipation device having a fixing bracket, wherein the fixing bracket connects the heat dissipation device to a computer enclosure to reduce pressure endured by the add-on cards due to weight of the heat dissipation device.

2. Description of Related Art

In order to enable desktop and other computers to cope with modern applications, like high-resolution graphics, wireless communication etc, add-on cards are often installed in computer devices to enhance their operative abilities. One example of such a card is a graphics card comprising a separate processor, called a GPU (graphics processor unit). The GPU generates a large amount of heat during operation. When the temperature of the GPU exceeds a certain level, the GPU may malfunction, or in the worst case fail outright. For this reason, a heat dissipation device is commonly installed on the GPU to dissipate the heat generated by the GPU and other electronic components adjacent to it into ambient air.

As the operation speed of electronic component becomes faster, the heat dissipation device needs to be larger to dissipate heat therefrom. Thus, high-speed add-on cards may become damaged by the weight of the heat dissipation device.

What is needed, therefore, is a heat dissipation device having a fixing bracket for the heat dissipation device to reduce the pressure endured by the add-on card due to the weight of the attached heat dissipation device.

SUMMARY OF THE INVENTION

A heat dissipation device for an add-on card in a computer enclosure includes a heat sink mounted on the add-on card and a fixing bracket. The fixing bracket includes a connecting portion fixed to the heat sink and a securing portion fixed to a panel of the computer enclosure. The fixing bracket is configured to rest part of weight of the heat sink on the computer enclosure.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
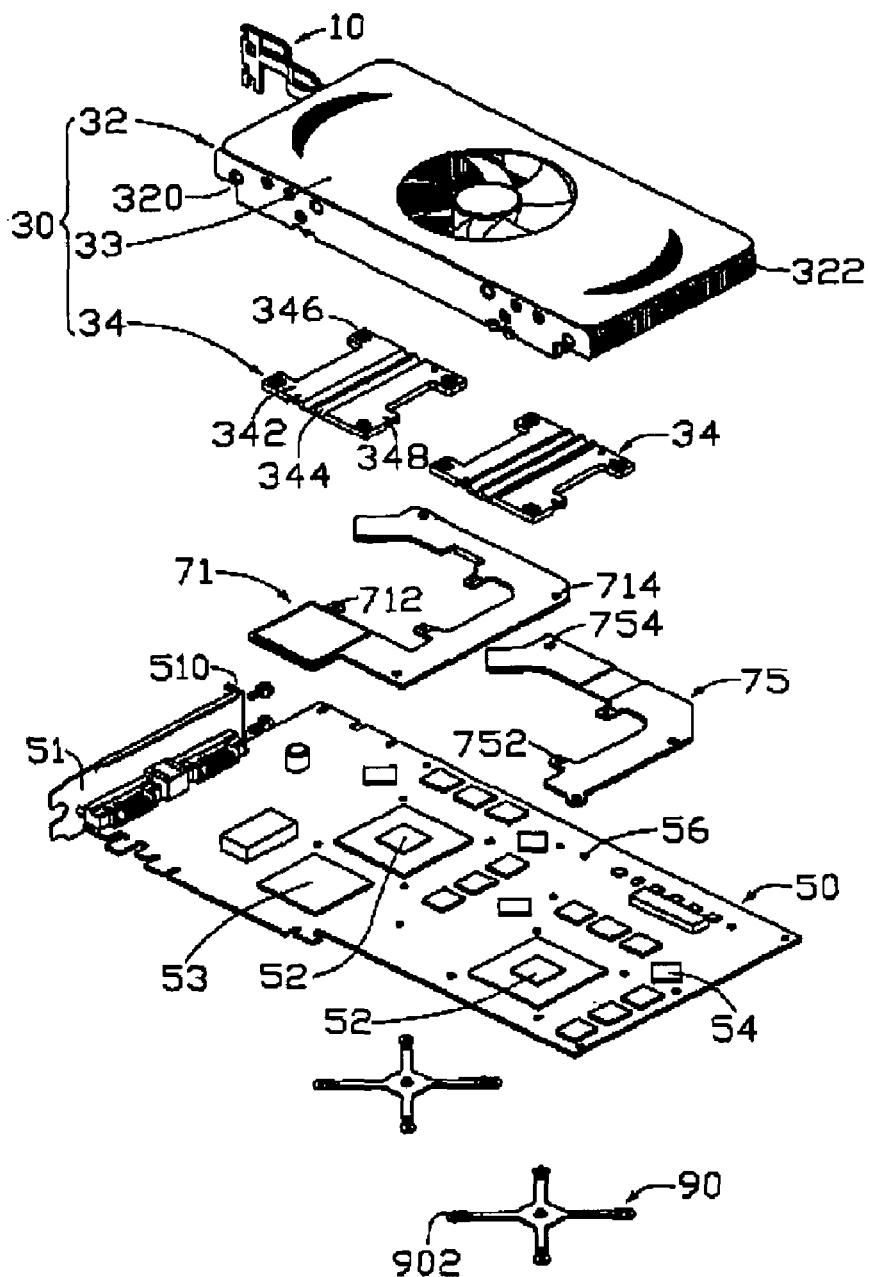
FIG. 1 is an exploded, isometric view of a heat dissipation device in accordance with a preferred embodiment of the present invention and a graphics card.

Referring to FIG. 1, a heat dissipation device in accordance with a preferred embodiment of the present invention is illustrated. The heat dissipation device is mounted on a graphics card 50 in a computer enclosure (not shown) and used for dissipating heat generated by a pair of GPUS 52 mounted on the graphics card 50 and other electronic components 53, 54 mounted around the GPUS 52. The heat dissipation device comprises a fixing bracket 10, a heat sink 30 and two conductor bases 71, 75. The fixing bracket 10 is attached to the heat sink 30 and cooperates with a panel (not shown) of the computer enclosure to rest part of weight of the heat sink 30 on the computer enclosure; thus, a pressure on the graphics card 50 due to the weight of the heat sink 30 is reduced.

The GPUS 52 are separately located at a top surface of the graphics card 50, and the electronic components 53,54 are located around the GPUS 52 and a plurality of through holes 56 are defined around the GPUS 52 and the electronic components 53, 54. A mounting plate 51 is perpendicularly formed at a rear edge of the graphics card 50. A flange 510 is formed at an end of the mounting plate 51 engaged with the fixing bracket 10 and the panel of the computer enclosure.

The heat sink 30 generally comprises a fin group 32, a pair of base plates 34 separately located at a bottom surface of the fin group 32, a plurality of heat pipes 40 thermally connecting the fin group 32 and the base plates 34, and a lid 33 mounted onto the fin group 32. A fan (not labeled) is mounted on a top of the fin group 32. The lid 33 is mounted on the fin group 32 and covers the fan, and the lid 33 defines an opening (not labeled) in alignment with the fan. An airflow generated by the fan can flow through the fin group 32 to take heat away therefrom.

Figure 2:
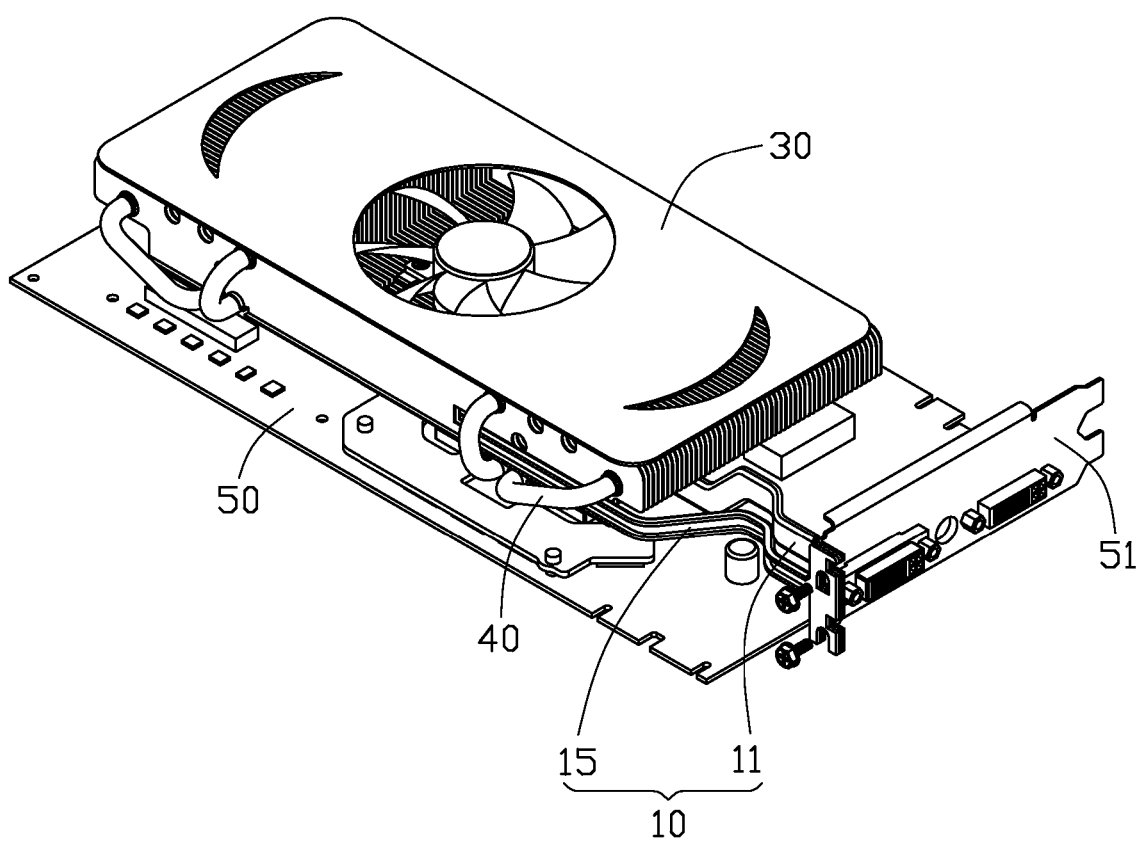
FIG. 2 is an assembled view of FIG. 1, wherein the heat dissipation device having a fixing bracket is assembled to the graphics card.
Figure 3:
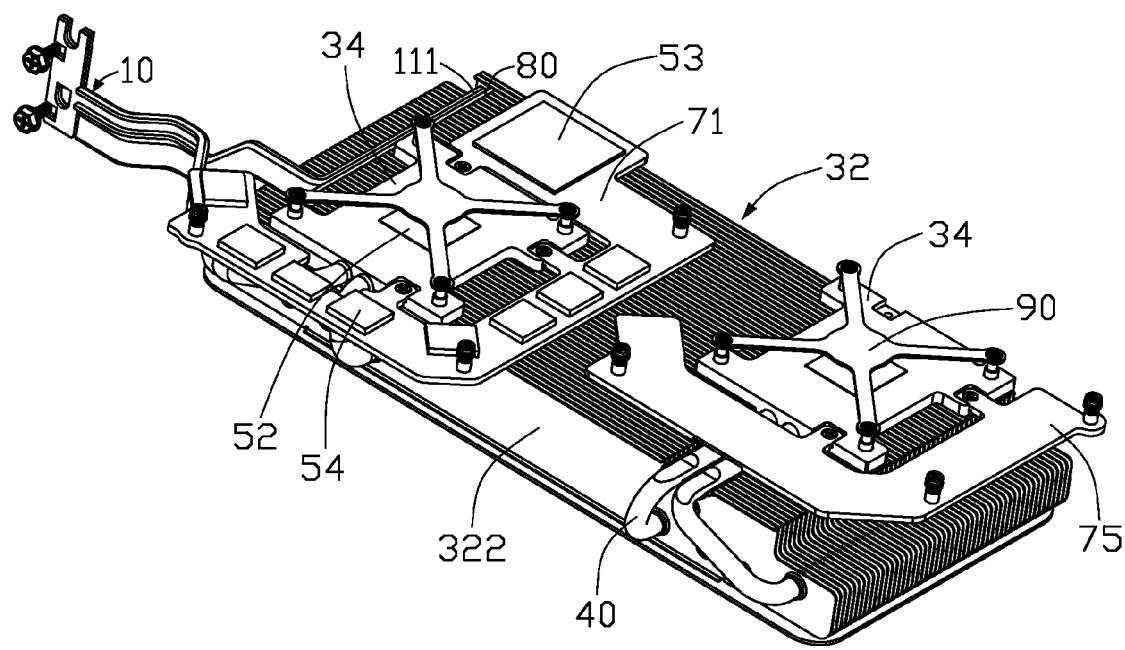
FIG. 3 is a view similar to FIG. 2, but shown from a bottom of the heat dissipation device and the graphics card taken away.

Referring to FIGS. 2-3, the fin group 32 comprises a plurality of parallel fins 322. The fin group 32 is cut away at a lower portion at opposite front and rear sides thereof to define a pair of opposite cutouts 320. Each base plate 34 has a rectangular shape and has a bottom face for contacting with the GPU 52. Four ears (not labeled) are formed at four corners of each base plate 34. A mounting hole 346 is defined in each of the ears of the base plate 34 for providing a passage for a corresponding fastener (not shown) to fix the heat dissipation device on the graphics card 50. A screw hole 348 is defined in three of the ears and located beside the mounting holes 346. A pair of adjoining semicircular grooves 344 are defined on a top surface 342 of each of the base plates 34 for receiving the heat pipes 40 therein.

The conductor bases 71, 75 are attached on a top surface of the electronic components 53, 54 for dissipating heat generated by the electronic components 53, 54. A plurality of through holes 712, 714, 752, 754 are defined in the conductor bases 71, 75, wherein the through holes 712, 752 are aligned with corresponding screw holes 348 and the through holes 714, 754 are aligned with corresponding through holes 56. After the base plates 34 are assembled with the fin group 32, screws (not shown) extend through the through holes 712, 752 of the conductor bases 71, 75 and the screw holes 348 in series to attach the conductor bases 71, 75 to the base plates 34. The configuration of the conductor bases 71,75 depends on distribution of the electronic components 53,54 mounted on the graphics card 50.

The heat dissipation device further comprises two back plates 90 to reinforce the graphics card 50. The back plates 90 are separately positioned below the bottom side of the graphics card 50. Each back plate 90 is cross-shaped and defines four through holes 902 therein. Four screws (not labeled) extend through the through holes 902 of each back plate 90 and corresponding through holes 56 of the graphics card 50 around a corresponding GPU 52 to threadedly engage in the mounting holes 346 of a corresponding base plate 34 to mount the back plates 90 to the graphics card 50. Thus, the heat dissipation device is mounted to the graphics card 50.

Figure 4:
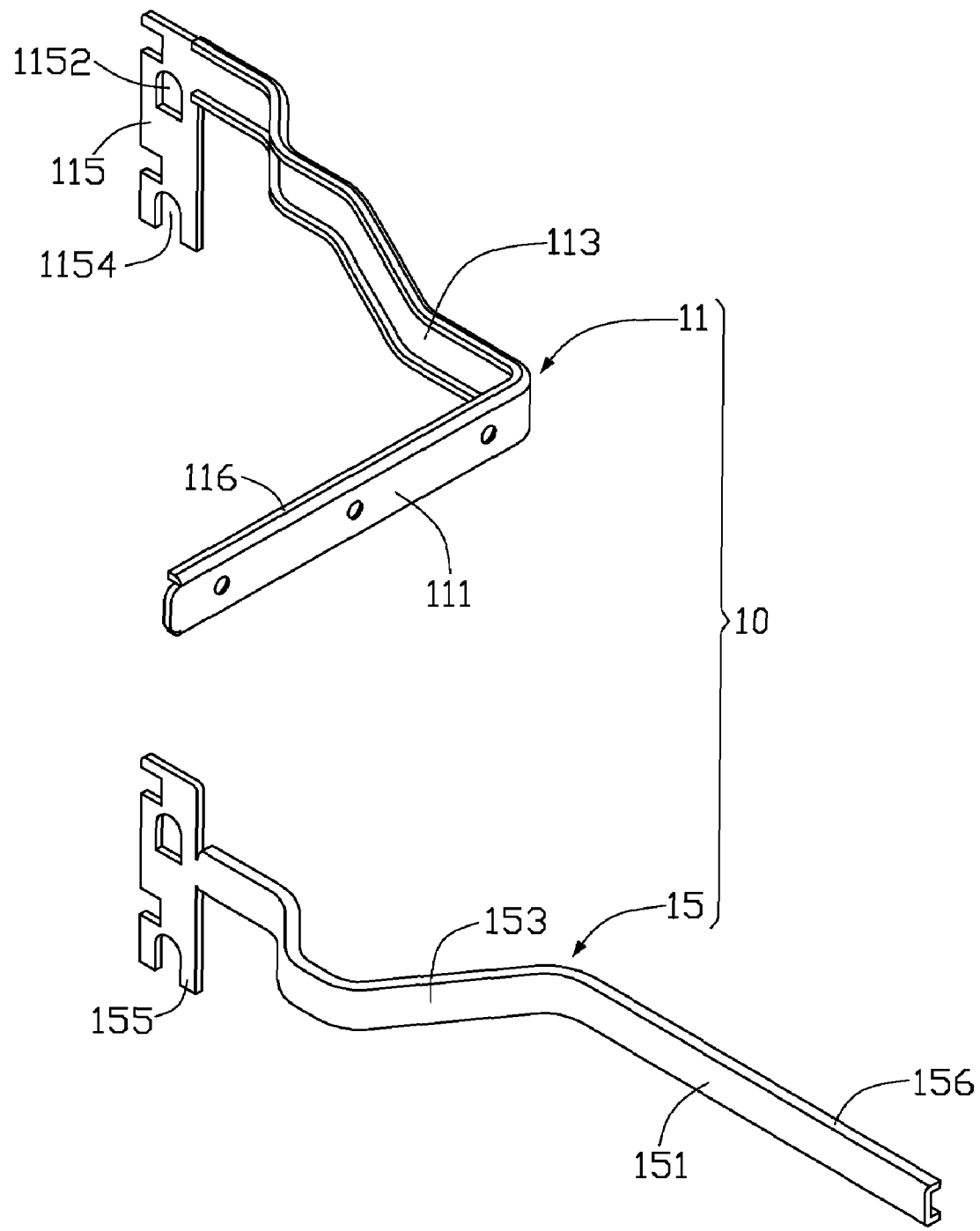
FIG. 4 is an enlarged view of the fixing bracket of FIG. 1.

Referring to FIGS. 3-4, the fixing bracket 10 is made from a metallic sheet and comprises a first fixing bracket 11 and a second fixing bracket 15.

The first fixing bracket 11 comprises a connecting portion 111, an extension portion 113 extending from an end of the connecting portion 111 and a securing portion 115 extending perpendicularly from a free end of the extension portion 113. The connecting portion 111 has an elongated rectangular configuration and engages with a rear edge of the fin group 32 at the cutout 320 adjacent to the mounting plate 51 of the graphics card 50. The securing portion 115 has a top surface aligned with top surfaces of the connecting portion 111 and extension portion 113. A mounting plate 80 having a configuration similar to the connecting portion 111 is mounted on the rear edge of the fin group 32. Screws (not shown) extend through the connecting portion 111 and the mounting plate 80 to fasten the connecting portion 111 to the fin group 32. Alternatively, the connecting portion 111 can be directly soldered to the rear edge of the fin group 32. The extension portion 113 has a curved configuration to increase the elasticity of the first fixing bracket 11. A pair of reinforced ribs 116 are formed at opposite top and bottom surfaces of the connecting portion 111 and the extension portion 113 in generally parallel directions. Each reinforced rib 116 is a strip configured to reinforce the strength of the first fixing bracket 11. The securing portion 115 defines two through holes 1152, 1154.

The second fixing bracket 15 is similar to the first fixing bracket 11 and comprises a connecting portion 151, an extension portion 153 and a securing portion 155. The connecting portion 151 has an elongated rectangular shape and is soldered to another side of the fin group 32. The extension portion 153 extends from an end of the connecting portion 151. The securing portion 155 extends perpendicularly from the extension portion 153 and in a similar direction to the securing portion 115 of the first fixing bracket 11. A joint (not labeled) between the extension portion 153 and the securing portion 155 is located generally in a middle portion of a side surface of the securing portion 155 in a manner such that the extension portions 113, 153 are staggered with each other when the two securing portions 115, 155 are engaged with each other to be screwed to the flange 510 of the mounting plate 51 and the panel of the computer enclosure. A pair of reinforced ribs 156 are formed at opposite top and bottom surfaces of the connecting portion 151 and the extension portion 153 in generally uniform directions. The reinforced rib 156 is a strip configured for reinforcing the second fixing bracket 15.

Referring to FIG. 2, in assembly, the connecting portions 111, 151 of the fixing bracket 10 are fixed to the fin group 32 and the securing portions 115, 155 are overlapped each other. The connecting portions 111 and 151 are perpendicular to each other. Screws (not labeled) extend through the through holes 1152, 1154 and corresponding through holes (not labeled) of the securing portions 115, 155 and the flange 510 of the mounting plate 51 of the graphics card 50 to threadedly engage with the panel of the computer enclosure to mount the first and the second fixing bracket 11, 15 together with the heat sink 30 also on the computer enclosure. By the fixing bracket 10, a part of weight of the heat sink 30 is supported by the panel of the computer enclosure; thus, pressure on the graphics card 50 due to the weight of the heat sink 30 can be lessened, whereby possibility of damage to the graphics card 50, particularly to the GUPS 52 due to the heavy weight of the heat sink 30 during transportation or operation of the computer can be reduced.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat dissipation device for an add-on card in a computer enclosure, comprising:
   a heat sink adapted to be mounted to the add-on card and thermally connecting with electronic components of the added-on card;
   a fixing bracket connecting with the heat sink and adapted for being secured to a panel of the computer enclosure to rest a part of weight of the heat sink on the computer enclosure, the fixing bracket comprising a connecting portion fixed to the heat sink, a curved extension portion extending outwardly from an end of the connecting portion and a securing portion extending from a free end of the extension portion, the securing portion being adapted to be connected to the panel of the computer enclosure; and
   another fixing bracket similar to the fixing bracket.

2. The heat dissipation device of claim 1, wherein the another fixing bracket comprises a connecting portion fixed to the heat sink, a curved extension portion extending from an end of the connecting portion, and a securing portion extending from a free end of the extension portion and adapted to be fixed to the panel of the computer enclosure, the connecting portion of the another fixing bracket and the connecting portion of the fixing bracket being oriented perpendicular to each other.

3. The heat dissipation device of claim 2, wherein the heat sink comprises a base plate adapted to be attached on the electronic components of the add-on card and a fin group mounted on the base plate.

4. The heat dissipation device of claim 3, wherein the connecting portion of the fixing bracket is fixed to a side of the fin group, and the connecting portion of the another fixing bracket is fixed to another side adjacent to the side of the fin group.

5. The heat dissipation device of claim 4, wherein the extension portion of the fixing bracket is staggered with the extension portion of the another fixing bracket.

6. The heat dissipation device of claim 5, wherein a pair of reinforce ribs are formed at opposite top and bottom surfaces of the connecting portion and the extension portion of each of the fixing bracket and the another fixing bracket in uniform directions.

7. The heat dissipation device of claim 2, wherein the connecting portions and the extension portions of the fixing bracket and the another fixing bracket are elongated.

8. The heat dissipation device of claim 3, wherein a fan is mounted on a top of the fin group, a lid is mounted on the fin group and covers the fan, and the lid defines an opening in alignment with the fan.

9. The heat dissipation device of claim 1 further comprising a back plate adapted to be mounted below a bottom side of the add-on card.

10. The heat dissipation device of claim 3 further comprising a conductor base adapted to be mounted around the base plate and cover other electronic components mounted on the add-on card.

11. An electronic assembly comprising:
an add-on card having a heat-generating electronic component thereon and a mounting plate adapted for mounting the add-on card to a panel of a computer enclosure;
a heat sink attached to the add-on card and thermally connecting with the heat-generating electronic component; and
a fixing bracket having a connecting portion fixed to the heat sink and a securing portion adapted to be fixed to the mounting plate of the add-on card and the panel of the computer enclosure.

12. The electronic assembly of claim 11, wherein the connecting portion of the fixing bracket has two branches which are fixed to different sides of the heat sink and perpendicular to each other.

13. The electronic assembly of claim 12, wherein the fixing bracket further comprises a curved extension portion interconnecting the two branches of the connecting portion and the securing portion.

* * * * *